United States Patent [19]

Yamamoto et al.

[11] Patent Number: 5,010,360
[45] Date of Patent: Apr. 23, 1991

[54] IMAGE FORMING APPARATUS

[75] Inventors: Takemi Yamamoto; Osamu Nagata; Ryohei Komiya; Jun Sakai; Yoshiyuki Ban, all of Nagoya, Japan

[73] Assignee: Brother Kogyo Kabushiki Kaisha, Nagoya, Japan

[21] Appl. No.: 589,095

[22] Filed: Sep. 27, 1990

[51] Int. Cl.$^5$ .................................. G03B 27/72
[52] U.S. Cl. ................................ 355/20; 355/27
[58] Field of Search ............ 346/110 R, 157; 355/20, 355/27

[56] References Cited

U.S. PATENT DOCUMENTS

| | | | |
|---|---|---|---|
| 4,760,426 | 7/1988 | Taniguchi et al. | 355/27 |
| 4,816,846 | 3/1989 | Kollarits | 346/157 |
| 4,918,536 | 4/1990 | Sakakibara et al. | 346/110 R X |
| 4,929,967 | 5/1990 | Hara | 346/110 R |
| 4,931,825 | 6/1990 | Suzuki et al. | 355/20 |
| 4,933,685 | 6/1990 | Asano et al. | 355/20 X |
| 4,935,749 | 6/1990 | Sakakibara et al. | 355/20 X |
| 4,935,767 | 6/1990 | Sangyoji et al. | 355/20 |
| 4,939,584 | 7/1990 | Sakakibara et al. | 346/110 R X |
| 4,965,592 | 10/1990 | Sangyoji et al. | 346/110 R |

Primary Examiner—Richard A. Wintercorn
Attorney, Agent, or Firm—Kane, Dalsimer, Sullivan, Kurucz, Levy, Eisele and Richard

[57] ABSTRACT

An image forming apparatus has a cathode ray tube as a light source which is controlled by a control circuit including an image signal inverting circuit for inverting a polarity of an image signal and a vertical deflecting circuit for inverting an image formed on the cathode ray tube in a mirror image relationship on the basis of the vertical synchronizing signal. Thus, the image forming apparatus can provide two kinds of color images obtained by using a microcapsule sheet or a silver chloride sheet.

5 Claims, 9 Drawing Sheets

INPUT SIGNAL

BLANKING ADDED SIGNAL

INPUT SIGNAL

BLANKING ADDED SIGNAL

CLAMPED SIGNAL

APPLIED SIGNAL ON
CATHODE RAY TUBE

VERTICAL SYNCHRONIZING SIGNAL

VERTICAL OSCILLATING SIGNAL

WAVEFORM OF VERTICAL
DEFLECTING YOKE

WAVEFORM OF VERTICAL
DEFLECTING YOKE

IMAGE FORMING APPARATUS

BACKGROUND OF THE INVENTION

This invention relates to an image forming machine having a cathode ray tube as a light source for obtaining an image on both photosensitive pressure-sensitive sheet and a color silver chloride sheet of heat-developing type.

Recently, there has appeared an image forming apparatus which forms an image on a special paper or sheet such as a photosensitive pressure-sensitive sheet (microcapsule sheet), a heat-developing color silver chloride photograph sheet or the like. Such a conventional image forming apparatus requires different hardware for each of the two kinds of sheets.

A photogram using the photosensitive pressure-sensitive sheet gives viewers a feeling or an impression different from that of a photograph using the heat-developing color silver chloride photograph sheet. That is, the photograph using the heat-developing color silver chloride photograph sheet has a better impression or feeling than that of the photograph using the photosensitive pressure-sensitive sheet. In contrast, the former is high in running cost in comparison with the latter. In this manner, the two photographs have different properties, and, accordingly, two types of photographs are selectively used in response to the respective characteristics required by a user. When the two photograms are used, two different hardwares are required for the image forming apparatus, respectively.

SUMMARY OF THE INVENTION

It is an object of this invention to provide an image forming apparatus which can be adapted for both a photosensitive pressure-sensitive microcapsule sheet and a heat-developing silver chloride photograph sheet.

According to this invention, there is provided an image forming apparatus for forming an image on a sheet by using a cathode ray tube as a light source which comprises; a cathode ray tube for selectively emitting light signals onto a photosensitive pressure-sensitive sheet or heat-developing color silver chloride sheet; a first sheet accommodating portion for accommodating a plurality of developing sheets cooperating with the photosensitive pressure-sensitive sheet; a second sheet accommodating portion for accommodating a plurality of silver chloride sheets; a transferring mechanism for transferring the photosensitive pressure-sensitive sheet so as to form an exposing portion located opposite to the cathode ray tube, the silver chloride sheet being selectively portioned at the exposing portion; a pressure developing unit disposed along a transferring path of the photosensitive pressure-sensitive sheet for transferring a latent image formed on the photosensitive pressure-sensitive sheet onto the developing sheet fed from the first sheet accommodating portion; a heat-fixing unit for fixing an image on the developing sheet or the silver chloride sheet; and a controlling circuit for controlling the cathode ray tube, which comprises an image signal inverting means for inverting a polarity of an image signal so as to invert light and darkness of an image formed on the cathode ray tube and/or a deflecting circuit for inverting an image formed on the cathode ray tube in a mirror image relationship.

Further objects, features and other aspects of this invention will be understood from the following detailed description of the preferred embodiments of this invention with reference to the drawings.

DETAILED DESCRIPTION OF THE INVENTION

Figure 1:
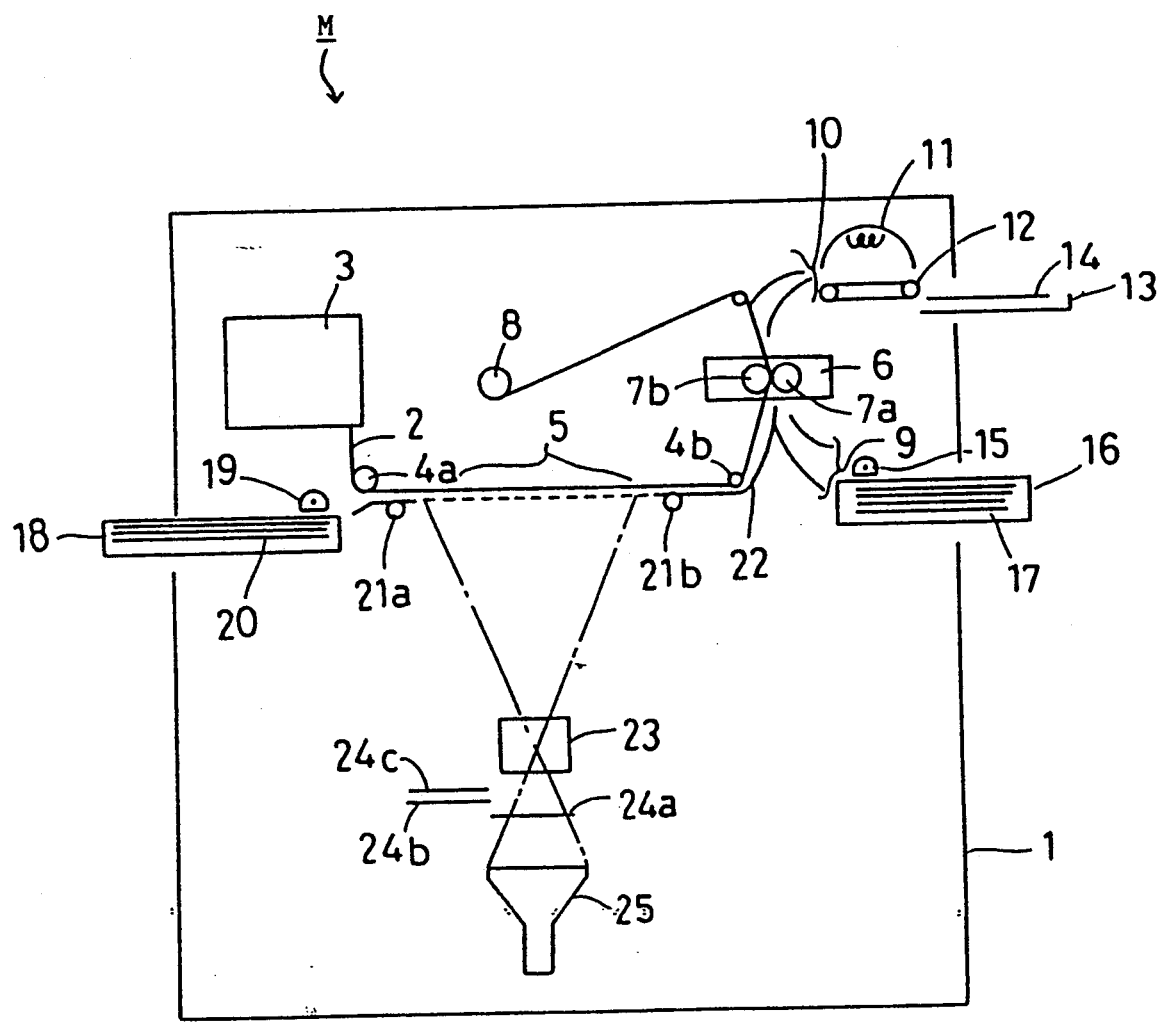
FIG. 1 is a structural view of an image forming apparatus according to this invention.

In FIG. 1, an image forming apparatus M of this invention has a casing 1 in which a continuous photosensitive pressure-sensitive sheet (microcapsule sheet) is disposed to be fed horizontally by a pair of transfer rollers 4a, 4b. The transfer rollers 4a, 4b are disposed separately to form a horizontal exposing portion 5. The microcapsule sheet 2 is accommodated in a cartridge 3 from which part of the microcapsule sheet 2 is pulled out intermittently by the transfer roller 4a. Over the transfer roller 4b is provided a pressure developing unit 6 comprising a pair of pressure rollers 7a, 7b which are moved toward and away from each other. The microcapsule sheet 2 is taken up by a take-up roller 8 located over the exposing portion 5. On the left and right sides of the casing 1 are provided a cassette 18 for accommodating a plurality of silver chloride sheets 20 and a cassette 16 for accommodating a plurality of developing sheets 17. Two kinds of sheets are fed one by one by two semicircular feeding rollers 19, 15. There are a pair of transfer rollers 21a, 21b disposed along the exposing portion 5 for feeding the silver chloride sheets 20 which are guided to the pressure developing unit 6 along a guide path 22. The developing sheets 17 are guided to the pressure developing unit 6 via a guide path 9 synchronously with a latent image formed portion of the microcapsule sheet. The latent image formed portion and the developing sheet are fed in an overlapped state into a space between the two pressure rollers 7a, 7b. The developed sheet 17 is then separated from the overlapped portion of the microcapsule sheet 2 to be led into a heat-fixing unit 11 having a transfer belt 12 via a guide path 10. The heat-fixed sheet 17 is finally discharged as an output sheet 14 into a discharging tray 13.

Under the horizontal exposing portion 5 are disposed a lens 23 and a cathode ray tube 25 in a vertically aligned relationship. One of three optical color separation filters 24a, 24b, 24c is selectively located on an optical path between the lens 23 and the cathode ray tube 25.

The silver chloride sheets 20 and the microcapsule sheets 17 are selectively supplied. In the case of the silver chloride sheets 20, they are exposed by the cathode ray tube 25 as a light source at the horizontal exposing portion 5, and then fed into the heat-fixing unit 11 while passing through the pressure developing unit 6 with the two pressure rollers being separated from each other.

Figure 2:
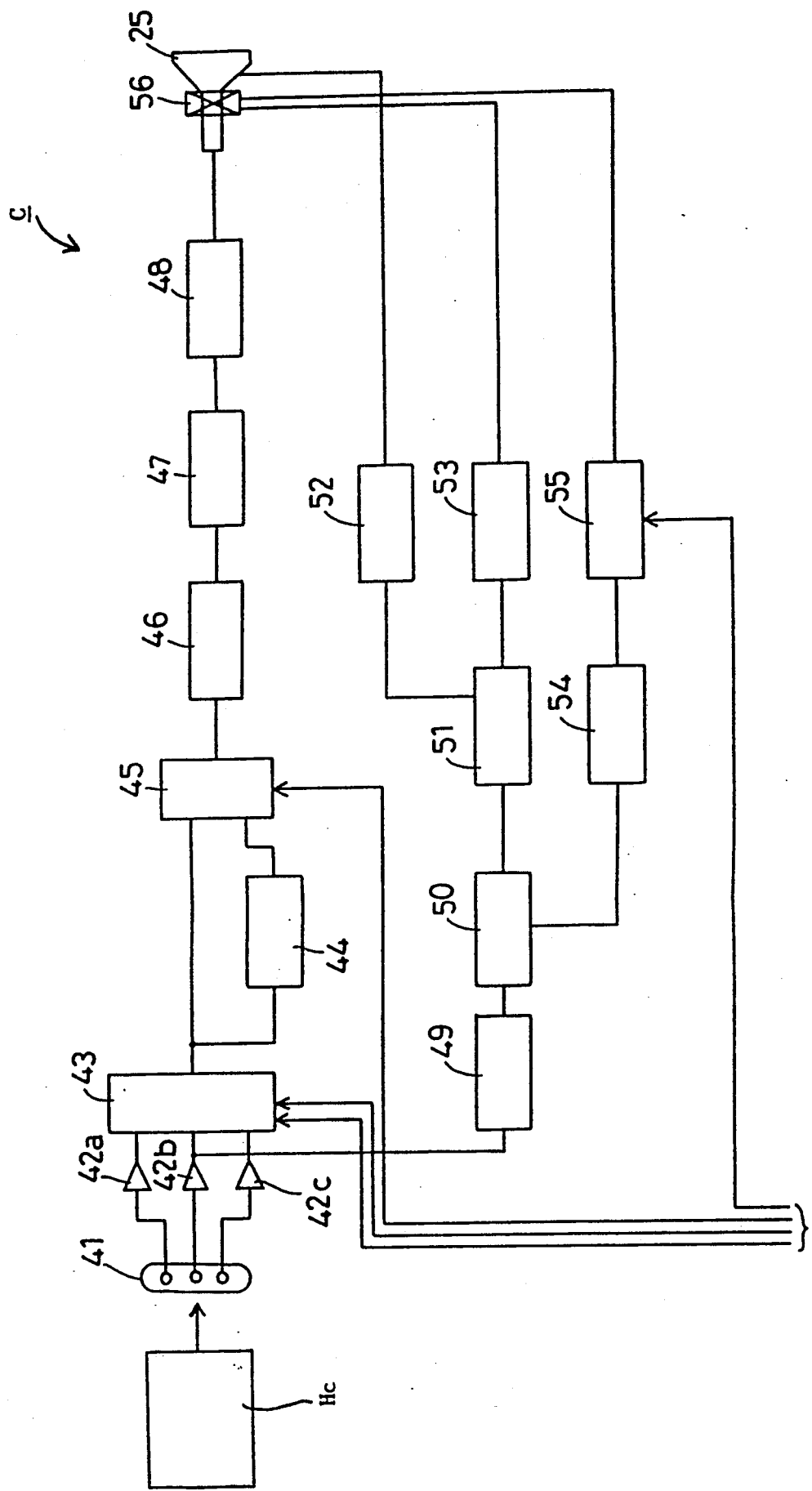
FIG. 2 is an electric block diagram for controlling a cathode ray tube assembled in the image forming apparatus.

The cathode ray tube 25 is controlled by a control circuit C shown in FIG. 2. An outer host computer Hc outputs an image signal to an input connector 41 from which a red color component signal, a blue color component signal and a green color component signal are inputted into a first data selector 43 via three amplifiers 42a, 42b, 42c, respectively. The data selector selects one of the three color component signals. The first data selector 43 is connected to a second data selector 45 for selecting either a non-inverted signal outputted from the first data selector 43 or a signal inverted by an inverted circuit 44. To the second data selector 45 are, in series, connected a blanking addition circuit 46 for processing a selected signal outputted therefrom so as to prevent the cathode ray tube 25 from emitting light during blanking interval, a clamper 47 for clamping the lowest voltage of a signal having passed the blanking addition circuit 46 at a DC level and a driving circuit 48 for driving a cathode of the cathode ray tube 25.

In contrast, the green component of an image signal sent from the host computer Hc is inputted into a synchronizing signal separation circuit 49 for separating the component of a synchronizing signal from the green image signal. The separated synchronizing signal is divided by a vertical and horizontal synchronizing separation circuit 50 into a vertical synchronizing signal and a horizontal synchronizing signal. The separated horizontal synchronizing signal is inputted into a horizontal oscillator 51 for controlling a current supplied to a deflecting yoke 56 provided on the cathode ray tube 25 via a horizontal driving circuit 53 so as to perform a horizontal deflection for a raster scanning. In addition, the horizontal oscillator 51 applys a high voltage onto the ray tube through a high voltage generating circuit 52.

The separated vertical synchronizing signal is inputted into a vertical oscillator 54 which controls the vertical deflection of the raster scanning through a vertical driving circuit 55.

Figure 3:
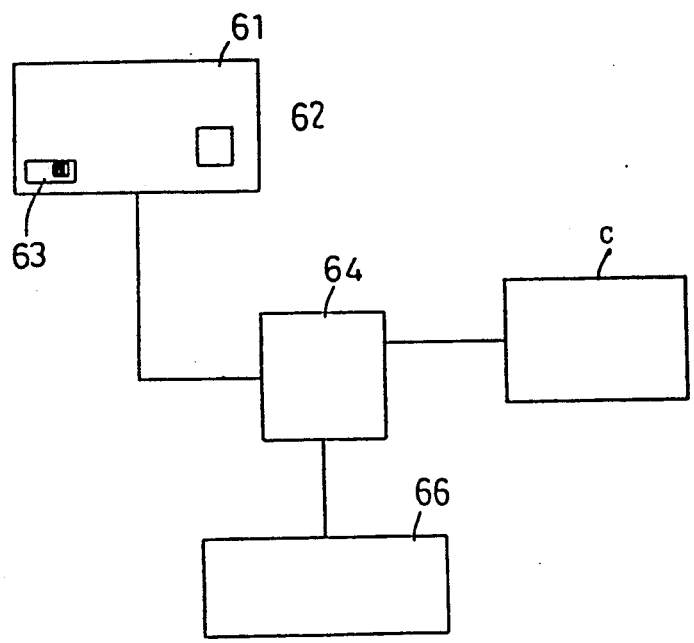
FIG. 3 is a block diagram of a system controller for controlling an electric circuit of the image forming apparatus.
Figure 4:
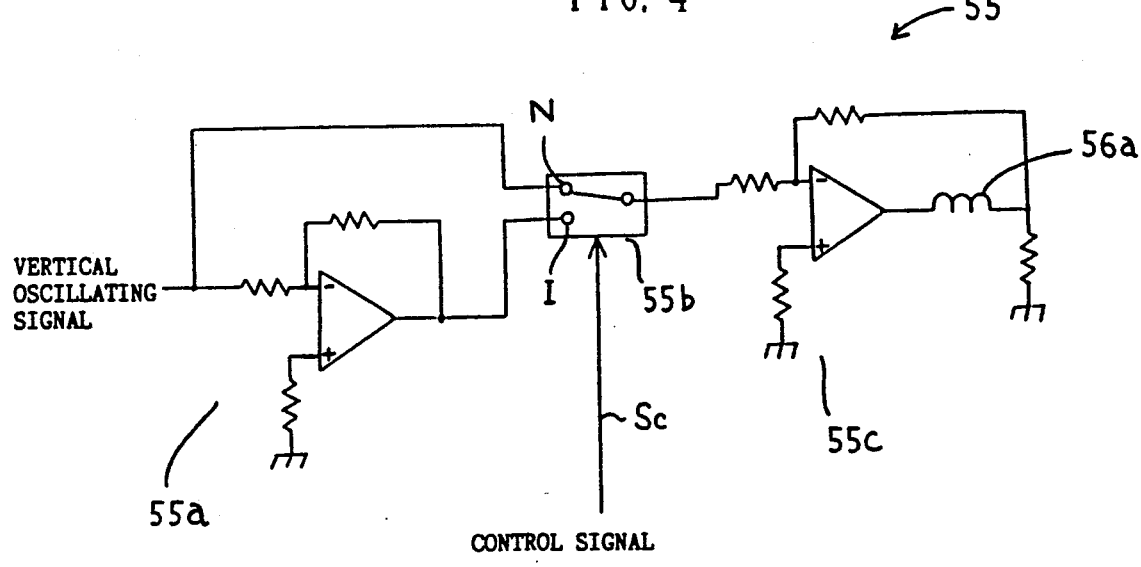
FIG. 4 is an electric circuit of a vertical drive circuit.

The vertical driving circuit 55 has, as shown in FIG. 4, an inverting circuit 55a for inverting a signal outputted from the vertical oscillator 54, a change-over switch 55b for selecting either a non-inverted signal or an inverted signal and a driving amplifier 55c to which a vertical deflection yoke 56a is connected. The change-over switch 55b comprises a normal (non-inverting) terminal N for selecting a vertical synchronizing signal and an inverting terminal I for selecting an inverted vertical synchronizing signal. The change-over switch 55b is controlled by a control signal Sc sent from a system controller 64 which also controls the first and second data selectors 43, 45. The system controller 64 is, as shown in FIG. 3, connected to a display panel 61 which has a start switch 62 for starting an image forming operation and a sheet selecting switch 63 for selecting either a microcapsule sheet or a silver chloride sheet. The system controller 64 further controls a mechanism control circuit 66 for controlling various mechanisms of the image forming apparatus.

The operation of the image forming apparatus will now be explained.

If a user desires to use the microcapsule sheet 2 together with the developing sheet 17, he operates the sheet selecting switch 63 for selecting them. When the system controller 64 confirms that the start switch 62 is pushed, it detects the stage of the sheet selecting switch 63. Thereafter, it controls the C.R.T. control circuit 65 and the mechanism control circuit 66 in the following manner.

First, the system controller 64 controls the mechanism control circuit 65 so as to select the color separation filter 24a. That is, the color separation filter 24a is located on the optical path as shown in FIG. 1. Then, the system controller 64 commands the C.R.T. control circuit C so that the first data selector 43 selects the red component of the image signal, the second data selector 45 selects the non-inverted signal and the changeover switch 55b selects the non-inverting terminal N. The cathode ray tube 25 is then operated.

Figure 5:
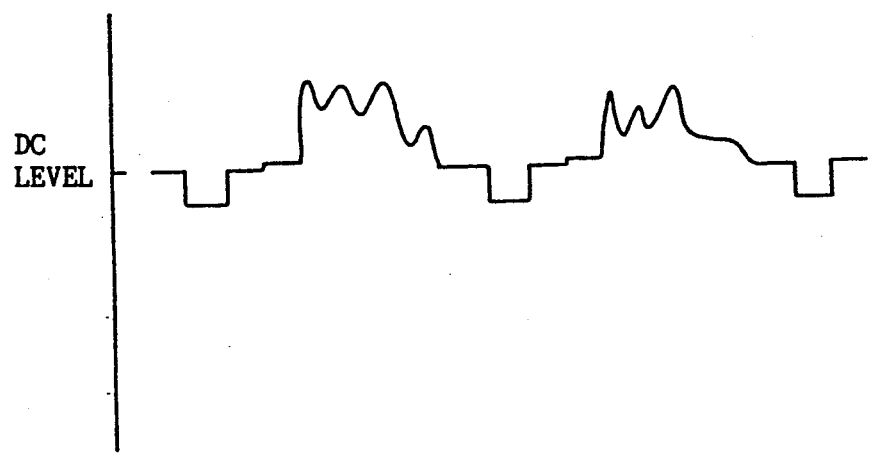
FIGS. 5a to 5d are waveform views showing an image signal process in the case of using a microcapsule sheet, respectively.
Figure 5:
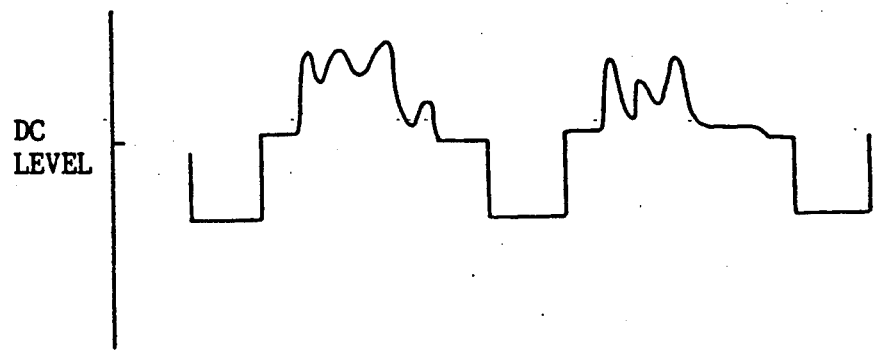
Figure 5C:
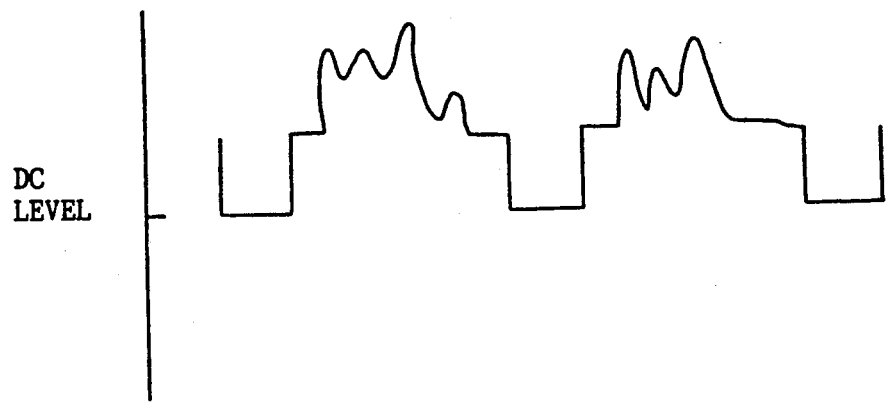
Figure 5D:
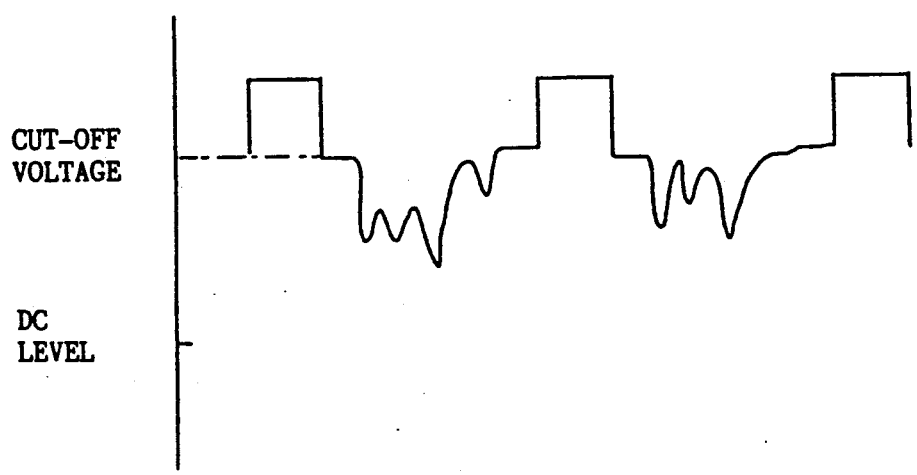

At this time, a certain color component signal inputted into the first data selector 43 is in the form shown in FIG. 5a. A blanking signal is then added to the inputted signal to form a waveform shown in FIG. 5b. Then, the blanking added signal is processed so that the lowest voltage of the signal is clamped at a DC level as shown in FIG. 5c. This clamped signal is, as shown in FIG. 5d, inverted by the drive amplifier 55c (FIG. 4) in a state wherein the black level of the image signal is equal to a cut off voltage. However, in case that a supplementary exposure is necessary, the black level of the image signal may be set at a value lower than the cut-off voltage.

Figure 7A:
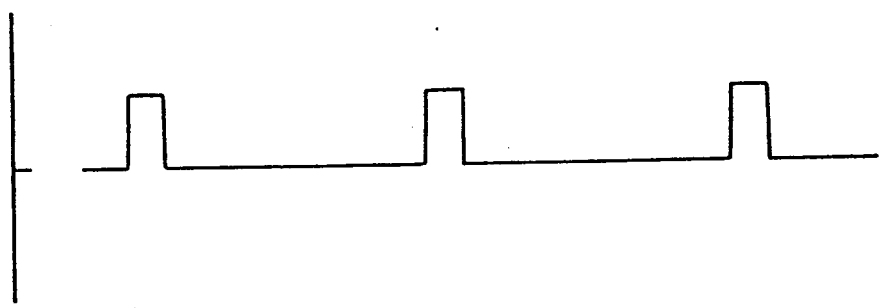
FIGS. 7a to 7d are waveform views of the vertical drive circuit, respectively.
Figure 7B:
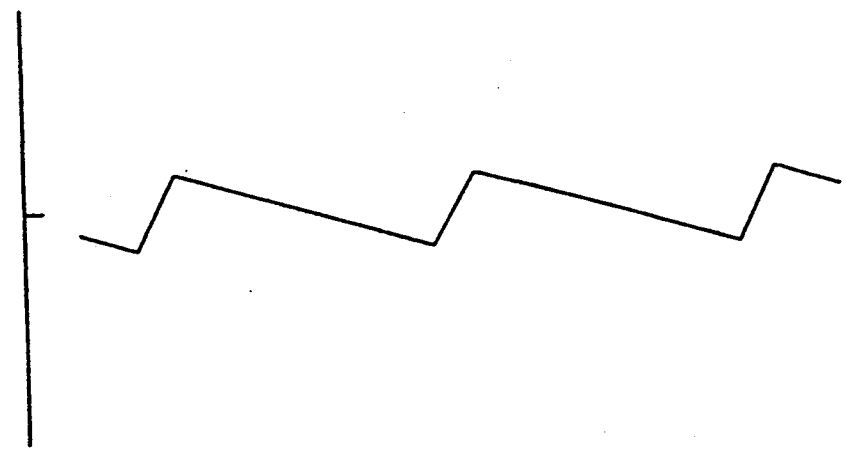

The vertical and horizontal synchronizing signal separation circuit 50 separates a vertical synchronizing signal shown in FIG. 7a from a compound synchronizing signal separated by the synchronizing signal separation circuit 49. The vertical oscillator 54 outputs a vertical oscillating signal, shown in FIG. 7b, formed on the basis of the vertical synchronizing signal. According to the vertical oscillating signal, the vertical driving circuit 55 outputs a signal shown in FIG. 7d to the vertical yoke 56a of the deflecting yoke 56. The driving amplifier 55c amplifies the vertical oscillating signal of FIG. 7b while inverting the signal. A lazer image on the C.R.T 25 is focused on the exposing portion 5 of the microcapsule sheet 2 through the filter 24a and the lens 23. The microcapsule sheet 2 is disclosed in Japanese Patent Laid-Open Publication No. 88739/1981.

With respect to the combination of the green component of the image signal and the green filter 24b and the combination of the blue component thereof and the blue filter 24c, similar operations are performed. Microcapsules in a position irradiated by the C.R.T. 25 are hardened while microcapsules in a position not irradiated thereby are remained as they are. The exposed portion of the microcapsule sheet 2 is fed to the pressure developing unit 6 synchronously with the developing sheet 17, and the exposed portion of the microcapsule sheet 2 and the developing sheet 17 is pressed by the pressure rollers 7a, 7b in an overlapped condition thereby to break microcapsules which are not hardened, so that a color image is formed on the developing sheet 17. Then, the developed sheet 17 having the color image is heat-fixed in the heat-fixing unit 11, and, thereafter, the developed sheet 17 is discharged onto the discharging tray 13. In association with this operation, the microcapsule sheet 2 is taken up by its predetermined length to prepare the next exposure.

As mentioned above, a color image forming operation is completed.

Next, a process in a case where a user desires a heat-development color silver chloride photograph will be explained.

In this case, the sheet selecting switch 63 is set so that each mechanism for the silver chloride photograph can be operated. That is, the feeding roller 19 and transfer rollers 21a, 21b are driven, and one silver chloride sheet 20 is fed to the exposing portion 5. At this time, a mechanism for processing the microcapsule sheet 2 and the developing sheet 17 cooperating therewith is not operated. The pressure rollers 7a, 7b of the pressure developing unit 6 are separated from each other so that the silver chloride sheet 20 can be passed.

With this state, the red filter 24a is located on the optical path. The first data selector 43 selects the red component of the image signal, the second data selector 45 selects the inverted signal thereof and the change-over switch 55b of the vertical driving circuit 55 selects the inverting terminal I. Thereafter, the C.R.T. 25 is operated.

Figure 6A:
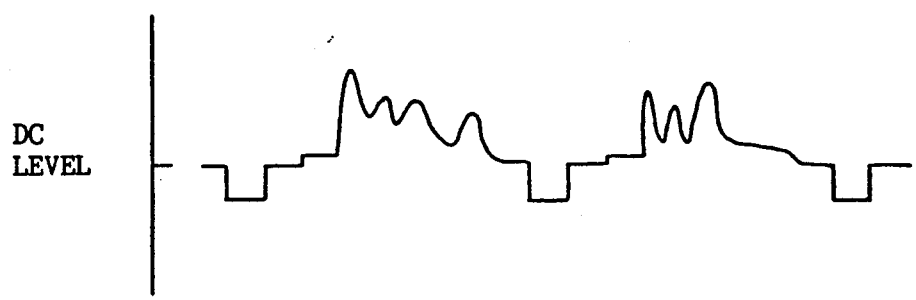
FIGS. 6a to 6d are waveform views for showing an image signal process in the case of a silver chloride sheet, respectively.
Figure 6B:
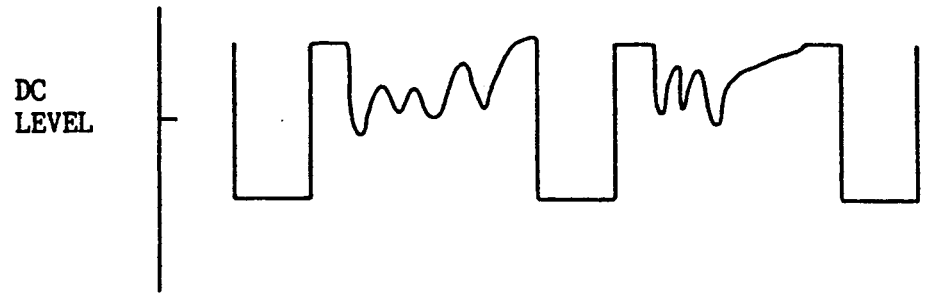
Figure 6:
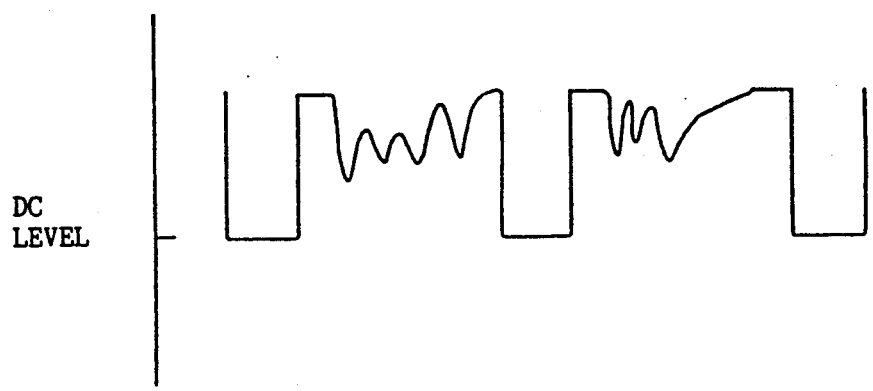
Figure 6:
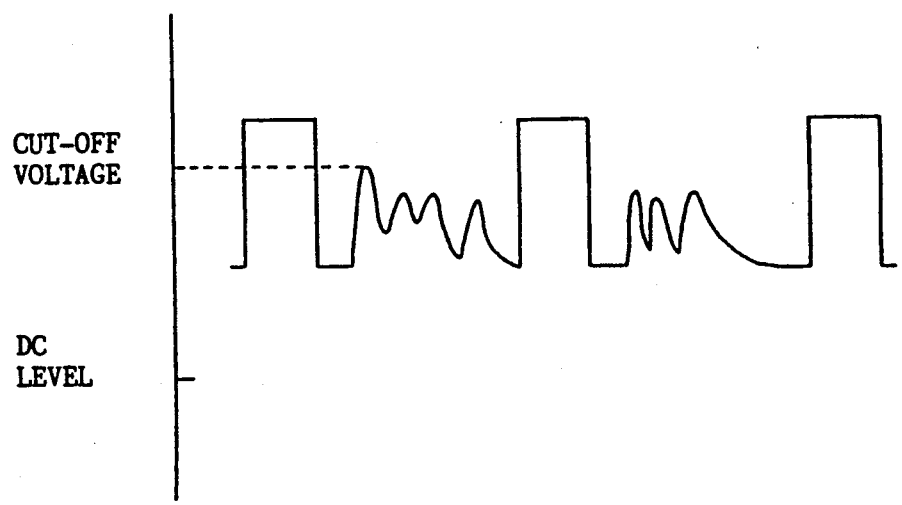

An input signal (FIG. 6a) selected by the first data selector 43 is inverted by the inverting circuit 44 to form a waveform shown in FIG. 6b through a blanking process by the blanking process circuit 46. Thereafter, the blanking added signal is clamped in the same manner as that of the process for the microcapsule sheet 2 and the developing sheet 17. The driving circuit 48 inverts the clamped signal to apply a signal shown in FIG. 6d onto the C.R.T. 25 in a state wherein the white peak of the image signal is equal to a cut-off voltage of the C.R.T. 25. In a case where a supplementary exposure is necessary, the white peak may be changed from the position shown in FIG. 6d.

Next, a signal applied to the vertical deflection yoke will be explained.

Figure 7C:
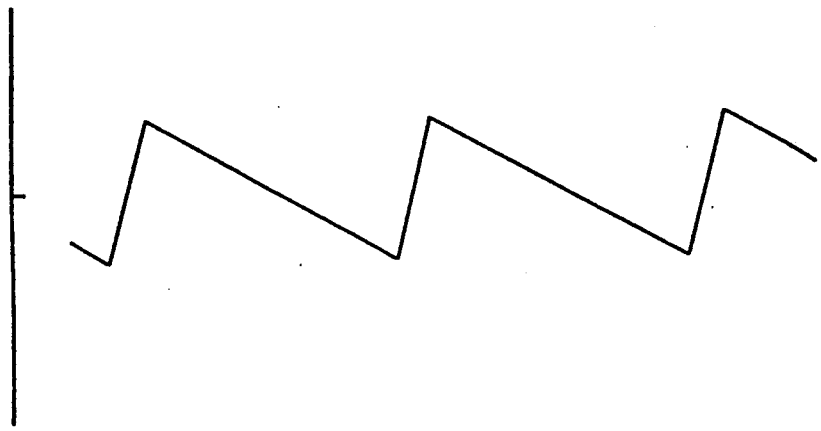
Figure 7D:
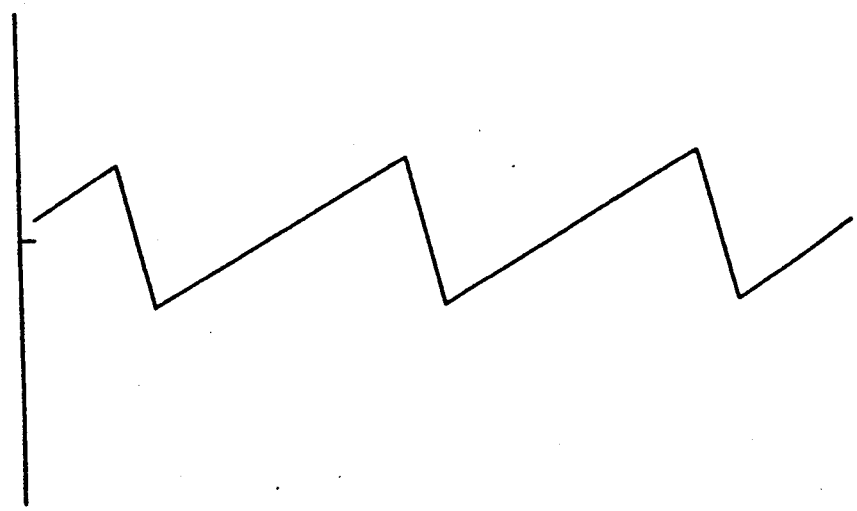

The vertical oscillating signal outputted from the vertical and horizontal synchronizing signal oscillating circuit 54 is inverted by the inverting circuit 55a and is then amplified by the driving amplifier 55c while being inverted to form a waveform shown in FIG. 7c. Accordingly, an electron beam of the C.R.T. 25 is directed in a direction reverse to that of the electron beam in the case of processing of the microcapsule sheet 2. That is, a latent image formed on the microcapsule sheet 2 is in a mirror symmetrical relationship with respect to an image formed on the silver chloride sheet 20. In other words, an image formed on the developing sheet 17 is in a mirror symmetrical relationship with respect to a latent image formed on the microcapsule sheet 2 because the latent image on the microcapsule sheet is transferred onto the developing sheet 17 by superposing two sheet on each other. An image formed on the silver chloride sheet 20 is in the same condition as that formed on the developing sheet 17.

The silver chloride sheet 20 is a non-transfer type color silver chloride photograph material such as a dry silver color manufactured by 3M company which is heat-developed and, for example, disclosed in Japanese Patent Laid-Open Publication 20683/1984 and 88254/1986. In this embodiment, a signal processing is effected with respect to a color development reaction of negative type.

Similar processings are performed with respect to the combination of the green component of the image signal and the green filter 24b and the combination of the blue component of the image signal and the blue filter 24c. As a result, a color latent image is formed on the silver chloride sheet 20 at the exposing portion 5. Thereafter, the transfer rollers 21a, 21b are driven to pass the sheet 20 between the two pressure rollers 7a, 7b separated from each other along the guide path 22 to send it to the heat-fixing unit 11. At this time, the transfer belt 12 is driven while the sheet 20 is heat-developed to be discharged onto the discharging tray 13 as an output sheet 14.

In this manner, a color image is formed on the silver chloride photograph sheet 20.

This invention is not limited to the embodiment mentioned above and may be made without departing from the spirit and scope thereof. For example, in this embodiment, a silver chloride sheet of non-transfer type is used, and, however, a silver chloride of transfer type may be used in such a manner that the pressure rollers 7a, 7b are used as transfer rollers.

As is apparent from the above explanation, according to this invention, the image forming apparatus can form by itself color image on both a microcapsule sheet and a heat-developing photograph sheet. An image formed on the C.R.T. 25 can be inverted in a mirror image symmetrical relationship, correct image in a correct direction can be outputted by only the image forming apparatus without provision of any additional devices in both cases of two types of sheets 17, 20.

What is claimed is:

1. An image forming apparatus for forming an image on a sheet by using a cathode ray tube as a light source which comprises;
   (a) a cathode ray tube for selectively emitting light signals onto a photosensitive pressure-sensitive sheet or heat-developing color silver chloride sheet;
   (b) a first sheet accommodating portion for accommodating a plurality of developing sheets cooperating with the photosensitive pressure-sensitive sheet;
   (c) a second sheet accommodating portion for accommodating a plurarity of silver chloride sheets;
   (d) a transferring mechanism for transferring the photosensitive pressure-sensitive sheet so as to form an exposing portion located opposite to the cathode ray tube, the silver chloride sheet being selectively portioned at the exposing portion;
   (e) a pressure developing unit disposed along a transferring path of the photosensitive pressure-sensitive sheet for transferring a latent image formed on the photosensitive pressure-sensitive sheet onto the developing sheet fed from the first sheet accommodating portion;
   (f) a heat-fixing unit for fixing an image on the developing sheet or the silver chloride sheet; and
   (g) a controlling circuit for controlling the cathode ray tube, which comprises an image signal inverting means for inverting a polarity of an image signal so as to invert light and darkness of an image formed on the cathode ray tube and/or a deflecting circuit for inverting an image formed on the cathode ray tube in a mirror image relationship.

2. An image forming apparatus according to claim 1, wherein the image signal inverting means is disposed between a first data selector for selecting one of red, green and blue components of an image signal at a time and a second data selector for selecting either a non-inverted signal outputted from the first data selector or an inverted signal processed by an inverting circuit.

3. An image forming apparatus according to claim 1, wherein the deflecting circuit comprises a vertical oscillating circuit for generating a vertical oscillating signal in accordance with a vertical synchronizing signal and a vertical driving circuit for inverting selectively the vertical synchronizing signal to drive a vertical deflecting yoke provided on the cathode ray tube.

4. An image forming apparatus according to claim 3, wherein the vertical driving circuit comprises an inverted circuit, a change-over switch for changing over between a non-inverted signal outputted from the vertical synchronizing circuit and an inverted signal processed by the inverted circuit, the change-over switch being controlled by a system controller.

5. An image forming apparatus according to claim 1, wherein the silver chloride sheet is fed into the heat-fixing unit through the pressure developing unit with its pressure rollers being separated from each other after a latent image is formed by the cathode ray tube thereon.

* * * * *